United States Patent
Nikonov et al.

(10) Patent No.: US 9,391,262 B1
(45) Date of Patent: Jul. 12, 2016

(54) NANOMAGNETIC DEVICES SWITCHED WITH A SPIN HALL EFFECT

(71) Applicant: Intel Corporation, Santa Clara, CA (US)

(72) Inventors: Dmitri E. Nikonov, Beaverton, OR (US); Sasikanth Manipatruni, Hillsboro, OR (US); Ian A Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/139,528

(22) Filed: Dec. 23, 2013

(51) Int. Cl.
*H01L 29/82* (2006.01)
*H01L 43/04* (2006.01)

(52) U.S. Cl.
CPC ..................... *H01L 43/04* (2013.01)

(58) Field of Classification Search
CPC ....... H01L 43/10; H01L 43/065; H01L 43/14; H01L 43/06; H01L 27/222; H01L 29/0665; H01L 43/04; H01L 27/226; H01L 31/035227; H01L 27/228; H01L 2223/54426; H01L 27/22; B82Y 10/00
USPC .......................................................... 257/421
See application file for complete search history.

(56) References Cited

U.S. PATENT DOCUMENTS

| 8,013,408 | B2 * | 9/2011 | Maehara et al. | 257/421 |
| 2009/0161265 | A1 * | 6/2009 | Sugano et al. | 360/324 |
| 2010/0097063 | A1 * | 4/2010 | Ando | B82Y 10/00 324/316 |
| 2012/0176154 | A1 * | 7/2012 | Behin-Aein | H03K 19/16 326/37 |
| 2013/0154633 | A1 * | 6/2013 | Fujiwara et al. | 324/251 |
| 2014/0139265 | A1 * | 5/2014 | Manipatruni | H03K 17/80 326/101 |

OTHER PUBLICATIONS

"International Technology Roadmap for Semiconductors", *Chapter PIDS*, www.itrs.net, 2011, 41 pages.
Auth, C., et al., "A 22nm High Performance and Low-Power CMOS Technology Featuring Fully-Depleted Tri-Gate Transistors, Self-Aligned Contacts and High Density MIM Capacitors", *2012 Symposium on VLSI Technology Digest of Technical Papers*, 2 pages.
Burr, G.W., et al., "Overview of Candidate Device Technologies for Storage-Class Memory", *IBM J. Res. & Dev.*, vol. 52 No. 4/5 Jul./Sep. 2008, 16 pages.
Chappert, Claude, et al., "The Emergence of Spin Electronics in Data Storage", *Nature Materials*, vol. 6, Nov. 2007, www.nature.com/naturematerials, 11 pages.
Donahue, M.J., et al., "OOMMF User's Guide", *National Institute of Standards and Technology Report* No. NISTIR 6376, Jun. 27, 2008, 227 pages
Hirsch, J.E., "Spin Hall Effect", *Physical Review Letters*, vol. 83, No. 9, Aug. 30, 1999, 4 pages.
Hosomi, M., et al., "A Novel Nonvolatile Memory with Spin Torque Transfer Magnetization Switching: Spin-RAM", *Electron Devices Meeting, 2005. IEDM Technical Digest. IEEE International*, 4 pages.

(Continued)

*Primary Examiner* — Wael Fahmy
*Assistant Examiner* — Sarah Salerno
(74) *Attorney, Agent, or Firm* — Blakely, Sokoloff, Taylor & Zafman LLP

(57) ABSTRACT

Described are Spin Hall Magnetic Random Access Memory (MRAM) cells and arrays. In one embodiment, an apparatus includes a nanomagnet having a cross-sectional area and a spin Hall effect (SHE) material. The SHE material is coupled to a subset of the cross-sectional area of the nanomagnet.

19 Claims, 10 Drawing Sheets

(56) References Cited

OTHER PUBLICATIONS

Kitagawa, E., et al., "Impact of Ultra Low Power and Fast Write Operation of Advanced Perpendicular MTJ on Power reduction for High-performance Mobile CPU", *Electron Devices Meeting (IEDM), 2012 IEEE International*, 4 pages.

Liu, Luqiao, et al., "Spin-Torque Ferromagnetic Resonance Induced by the Spin Hall Effect", *American Physical Society, Physical Review Letters*, 106, Jan. 21, 2011, 4 pages.

Liu, Luqiao, et al., "Spin-Torque Switching with the Giant Spin Hall Effect of Tantalum", *American Association for the Advancement of Science, Science*, vol. 336, May 4, 2012, www.sciencemag.orq, 5 pages.

Manipatruni, Sasikanth, et al., "Voltage and Energy-Delay Performance of Giant Spin Hall Effect Switching for Magnetic Memory and Logic", *Cornell University Library*, http://arxiv.org/abs/1301.5374, Jan. 23, 2013, 16 pages.

Nikonov, Dmitri E., et al., "Overview of BEyond-CMOS Devices and a Uniform Methodology for Their Benchmarking", *Proceedings of the IEEE*, vol. 101, Issue: Sep. 21, 2012, 36 pages.

Nikonov, Dmitri E., et al., "Uniform Methodology for Benchmarking Beyond-CMOS Logic Devices", *Electron Devices Meeting (IEDM), 2012 IEEE International*, 4 pages.

Nikonov, D., et al., "Wire Geometry for Spin Hall Effect Switching of Nanomagnets", *58th Annual Conference on Magnetism and Magnetic Materials*, Nov. 4-8, 2013, Denver, Colorado, Abstracts, http://www.magnetism.org/, 1 page.

Pai, Chi-Feng, et al., "Spin Transfer Torque Devices Utilizing the Giant Spin Hall Effect of Tungsten", *Applied Physics Letters*, 101, 122404 (2012), 5 pages.

Yoda, H., et al., "Progress of STT-MRAM Technology and the Effect on Normally-off Computing Systems", *Electron Devices Meeting (IEDM), 2012 IEEE International*, 4 pages.

\* cited by examiner

NANOMAGNETIC DEVICES SWITCHED WITH A SPIN HALL EFFECT

TECHNICAL FIELD

Embodiments of the invention are in the field of memory devices and, in particular, nanomagnetic devices that are switched with leveraged spin Hall effect.

BACKGROUND

On chip embedded memory with non-volatility can enable energy and computational efficiency. One approach for embedded memory options is STT-MRAM (Spin-Transfer Torque Magnetic Random Access Memory). Spin polarized current is generated towards a surface of a conductor (e.g., top and bottom surfaces of a conductor) if electric charge current is flowing along the conductor (wire). The Spin Hall Effect (SHE) occurs in materials with high spin-orbit coupling for electrons. SHE is quantified via a Spin Hall coefficient (theta SHE), which is the ratio of the spin polarized current density along a z-axis and charge current density along a y-axis for a conductive wire lying along the y-axis.

A conventional approach for magnetization switching by SHE is applied to ferromagnetic element (e.g. made of CoFeB) that is formed adjacent to a Spin Hall wire (e.g. tantalum or tungsten) that is significantly wider and longer than the ferromagnetic element. The spin polarized current is injected from the Spin Hall wire into an entire cross-sectional area of the ferromagnetic element. This leads to a large required current and large voltage drop in the wire.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
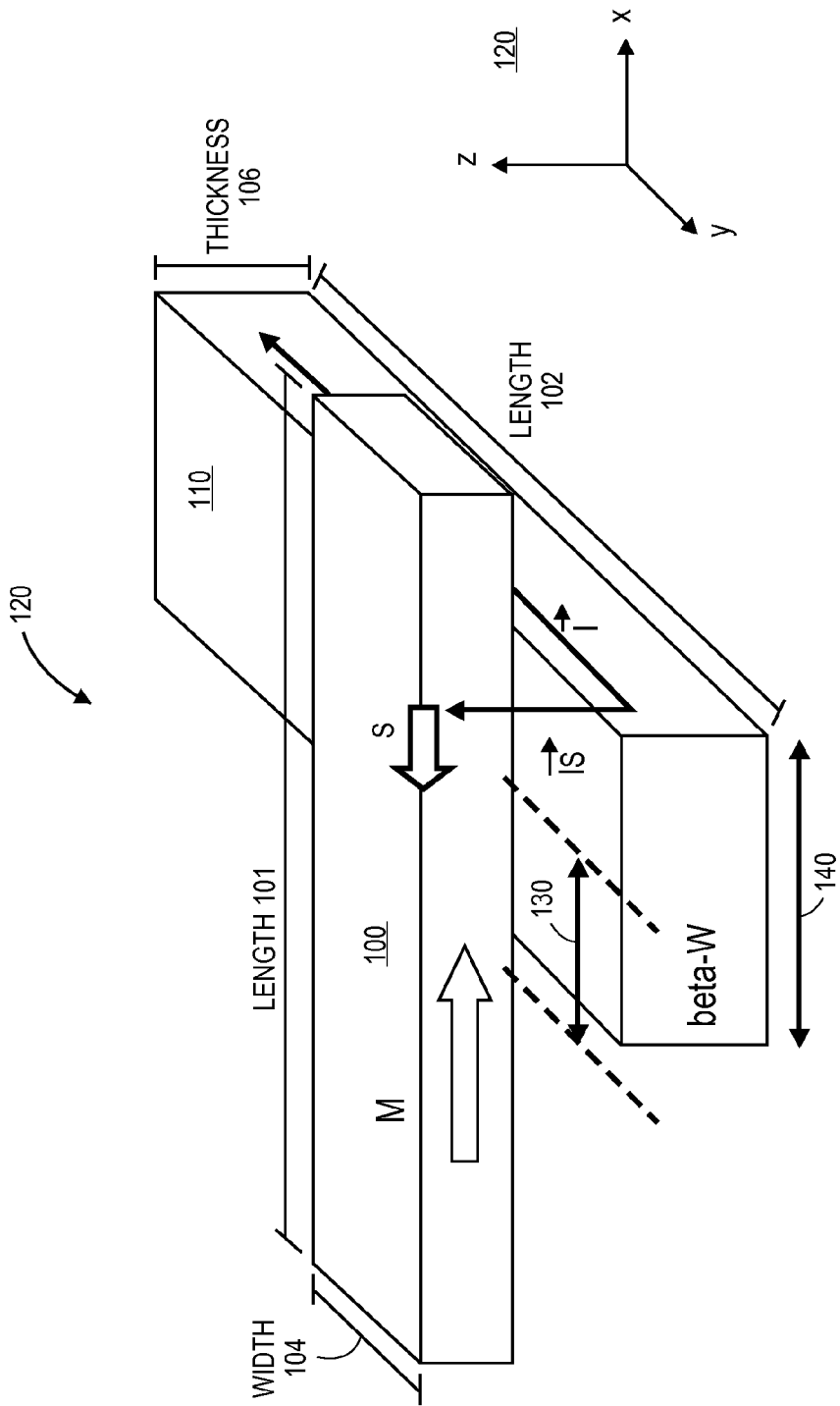
FIG. 1 illustrates a spin Hall switched nanomagnet in accordance with one embodiment.

Embodiments of the present disclosure include Spin Hall Magnetic Random Access Memory (MRAM) cells and arrays. In one embodiment, an apparatus includes a nanomagnet having a cross-sectional area and a spin Hall effect (SHE) material that is coupled to a subset of the cross-sectional area of the nanomagnet. The SHE material generates spin current that is injected from the SHE material into the subset of the cross-sectional area of the nanomagnet. A center of mass of the SHE material is offset from a center of mass of the nanomagnet such that the spin Hall effect is leveraged towards an edge of the nanomagnet rather than a center of the nanomagnet. This allows the nanomagnet to be switched faster and with a smaller current, which translates into smaller consumed power, in comparison to conventional approaches.

Embodiments of the present disclosure include a design for faster switching of magnetization involving high-aspect ratio (e.g., length/width approximately equal to 4, length/width greater than 3, etc.) nanomagnets and narrow Spin Hall wires offset from the center of the nanomagnet.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

As electronic circuits based on complementary metal-oxide-semiconductor (CMOS) transistors are being scaled to ever higher density of elements, the electronic circuits require larger arrays of memory. Electronic based memories (e.g. SRAM and DRAM) tend to be volatile. However non-volatile memories with high performance are required to decrease the power dissipation of computing systems. Such memories are likely to be based on Beyond CMOS technologies such as e.g. spintronics. Utilization of non-volatile elements may enable non-volatile logic, which would further decrease power dissipation.

The present state of art of spintronics or magnetic memories is the Spin Transfer Torque (STT) RAM. Recently switching of magnetization was demonstrated based on the Spin Hall Effect (SHE). From here on, we will refer to any effect which separates electrons with different spin polarization to different surfaces of a conductor as the spin Hall effect. The SHE switching is expected to occur with smaller switching energy and faster switching time. In these experiments, spin polarized current created by a SHE material is injected into a nanomagnet over its whole area.

As the sizes of integrated circuits shrink due to advances in lithography and patterning, it opens a possibility to create narrow nanoscale wires and narrow nanomagnets with high aspect ratio and hence high stability. In some embodiments, the effects of geometry of such narrow SHE switched memory elements is discussed. Lower threshold current and higher switching speed can be achieved by optimizing the width and position of the SHE wires.

FIG. 1 illustrates an apparatus 120 that includes a spin Hall switched nanomagnet 100 in accordance with one embodiment. The nanomagnet 100 includes a length 101 and a width 104. A longitudinal axis (x axis of coordinate space 102) is aligned with a length 101 of the nanomagnet. In the Spin Hall Effect, when a charge current $\vec{I}$ (e.g., charge current flows along y axis of coordinate space 120) flows in a wire 110 with width 140 and length 102 made out of non-magnetic material, a spin polarized current $\vec{I}_S$ (e.g., polarized current flows in z direction of coordinate space 120) is generated which flows towards its surface with spin polarization S parallel to its surface as illustrated in FIG. 1. For a strong effect, the SHE material of the wire 110 needs to have a large spin-orbit coupling, such as β-Tantalum (β-Ta), β-Tungsten (β-W) or Platinum (Pt). The Spin Hall injection efficiency, $P_{SHE}$, is the ratio of magnitude of transverse spin current to lateral charge current:

$$P_{she} = \frac{I_{sz}}{I_{cy}} = \frac{w_{nm}}{t} \theta_{SHE} \left(1 - \text{sech}\left(\frac{t}{\lambda_{sf}}\right)\right), \quad (1)$$

where $w_{nm}$ is the width 104 of the nanomagnet, t is the thickness 106 of the SHE metal electrode, $\lambda_{sf}$ is the spin flip length in the SHE metal, $\theta_{SHE}$ is the Spin Hall angle for the SHE-metal. In one embodiment, the experimental values of SHE angles are as follows: Pt (0.07), β-Tantalum (−0.15), β-Tungsten (0.3). One advantage of SHE includes generating spin polarized current that is significantly larger than the charge current, while the spin polarized current is smaller than the charge current in the case of Spin Transfer Torque effect.

The conductive wire 110 of a SHE material is placed in direct contact with the nanomagnet 100 and the longitudinal axis of the wire is oriented approximately (e.g., within +/−10 degrees) perpendicular to the nanomagnet's longitudinal axis (e.g., longitudinal axis is x-axis in FIG. 1). The spin polarization S injected into the nanomagnet and thus the torque acting on it is along its longitudinal axis. The direction of torque is changed by switching the direction of the charge current $\vec{I}$. This enforces switching of the magnetization to point to the right or left, along the longitudinal axis, which we designate as logical '0' and '1', respectively. This structure permits one to tailor the distribution of the SHE spin torque by varying the offset 130 and width 140 of the SHE wire. The offset 130 is a distance between a center of mass of the nanomagnet and a center of mass of the wire. The wire can be located in any position from a left edge of the wire being aligned with a left edge of the nanomagnet to a right edge of the wire being aligned with a right edge of the nanomagnet. Displacing the area of application of the spin torque enables it to rotate magnetization with more leverage and to produce a non-uniform distribution of magnetization in the switching process. This results in a more efficient switching of magnetization.

In one embodiment, an apparatus 120 includes a nanomagnet 100 having a longitudinal axis and a wire 110 having spin Hall effect (SHE) material having a longitudinal axis. The SHE material is coupled to the nanomagnet with the longitudinal axis of the nanomagnet being approximately perpendicular with respect to a longitudinal axis of the wire having SHE material. A center of mass of the SHE material is offset from a center of mass of the nanomagnet. Spin current is injected from the SHE material into a subset (e.g., less than 50%, less than 40%) of a cross-sectional area (length×width) of the nanomagnet.

The center of mass of the SHE material may be offset from the center of mass of the nanomagnet by ten to sixty nanometer. The center of mass of the SHE material may be maximally displaced relative to the center of mass of the nanomagnet such that torque exerted by the SHE material is maximally leveraged and causes switching of magnetization initially near an edge of the nanomagnet. This geometry results in a more efficient turning of magnetization by switching the magnetization initially at the edge of the ferromagnet and then letting the switched direction propagate to the other portion of the ferromagnet. Also, a wire with a smaller width permits a smaller overall current for a given spin polarized current density.

The SHE material may have a width of eighty nanometers or less. The nanomagnet may include a free magnetic layer (e.g., CoFeB) that is coupled to the SHE material.

The operation of a Spin Torque switching can be modeled with the NIST micromagnetic simulator OOMMF. For our simulations, the magnetization value $M_s=10^6$ A/m and the exchange constant $A=10^{-11}$ J/m, and Gilbert damping $\alpha=0.008$. No material anisotropy is included in the simulations. Various values of width and offset of the SHE wire as well as values of spin-polarized current are simulated. Thermal fluctuations of magnetization are not included. Their effect is emulated by a small angle (10°) of rotation in the spin polarization from the long axis of the nanomagnet. This non-zero angle is necessary for Spin Torque switching to start.

Figure 2A:
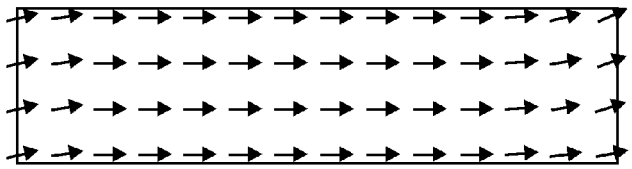
FIGS. 2A-2H show magnetization distributions for switching a nanomagnet with spin current injected over an entire area of the nanomagnet.
Figure 2B:
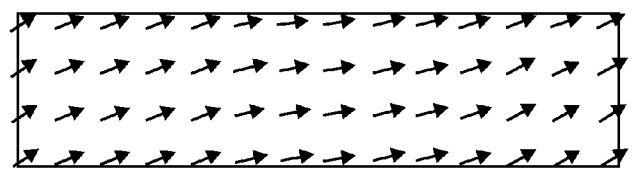
Figure 2C:
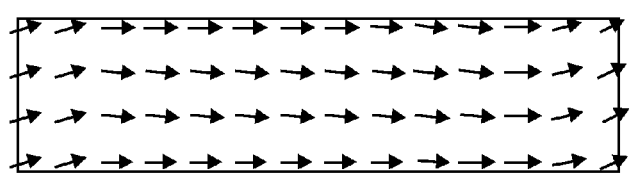
Figure 2D:
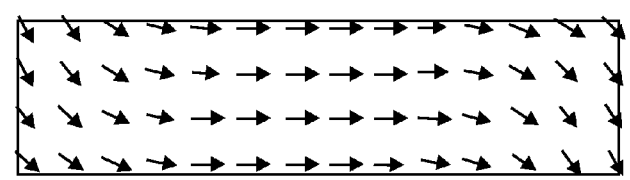
Figure 2E:
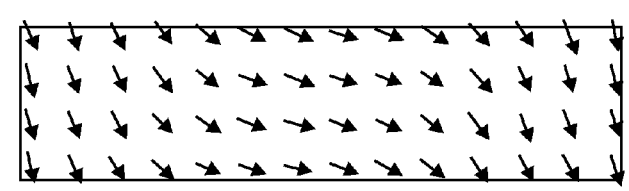
Figure 2F:
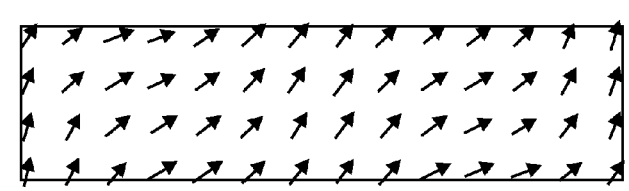
Figure 2G:
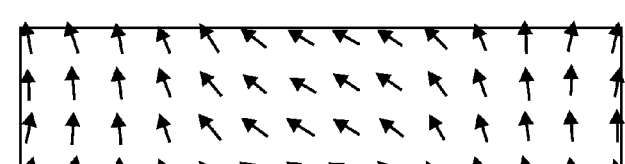
Figure 2H:
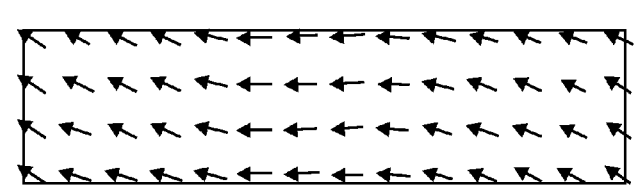

Patterns of magnetization in the switching process of a nanomagnet are shown in FIGS. 2A-2H and 3A-H. The initial state of magnetization is pointing to the right as illustrated in FIG. 2A. Current is switched on at time 0 ns. FIGS. 2A-2H show magnetization distributions with a time interval of 0.4 ns between figures for a spin polarized current of 120 µA being injected in a nanomagnet of 80×20×2.5 nm size with a SHE wire (width=80 nm, no offset). That is a spin polarized current is injected over the whole area of the nanomagnet. Switching occurs by a relatively uniform rotation of magnetization as illustrated in FIG. 2A-2H. In this case, the SHE torque is applied over the entire cross-sectional area of the nanomagnet. This pattern of switching is close to the traditional STT switching. There are noticeable non-uniformities of magnetization at the ends of the nanomagnet caused by the demagnetization effect aligning magnetization parallel to the surface of the nanomagnet. However the overall magnetization for the majority of the nanomagnet's area is quite uniform. It starts oscillating around the direction of equilibrium (to the right in this case) and then rotates as a whole unit to point to the left as illustrated in FIG. 2H. Notice that it takes a relatively long time (~4 ns) to achieve a significant deviation of magnetization from the equilibrium, which is typical for STT switching.

Figure 3A:
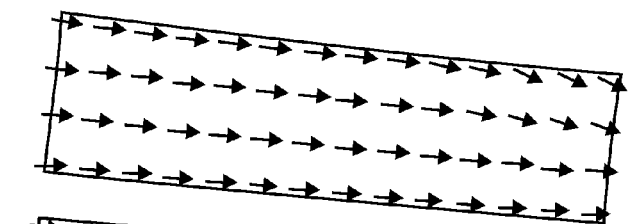
FIGS. 3A-3H show magnetization distributions for switching a nanomagnet with spin current injected over a subset of an entire area of the nanomagnet.
Figure 3B:
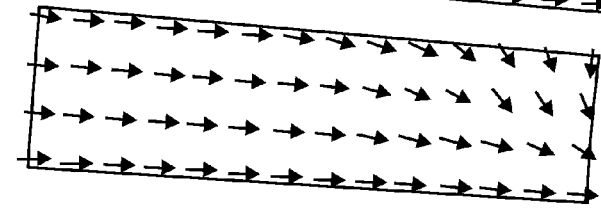
Figure 3C:
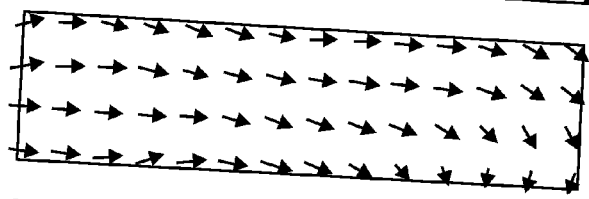
Figure 3D:
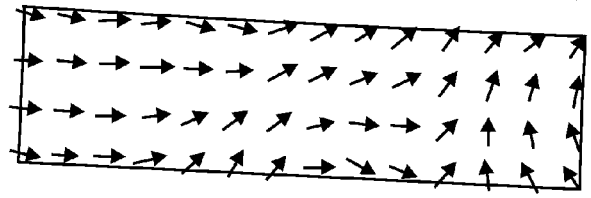
Figure 3E:
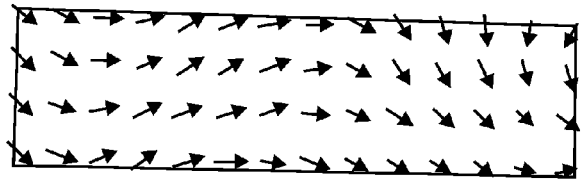
Figure 3F:
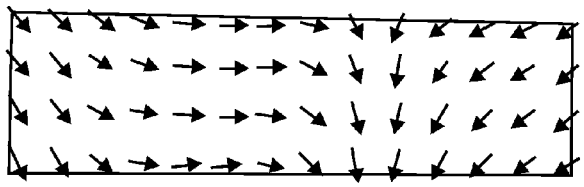
Figure 3G:
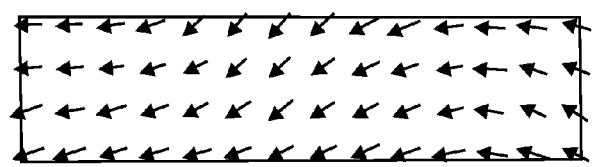
Figure 3H:
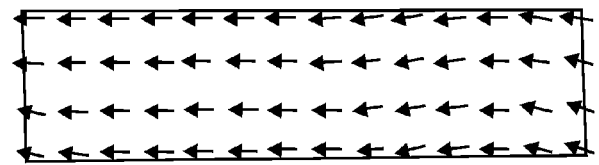

Patterns of magnetization for when the SHE torque is shifted to the right end of the nanomagnet are shown in FIGS. 3A-3H in accordance with one embodiment. In this case, oscillations of magnetization start at the right end (FIG. 3A) and then propagate to the left (FIG. 3H). The initial state of magnetization is pointing to the right as illustrated in FIG. 3A. Current is switched on at time 0.1 ns. FIGS. 3A-3H show magnetization distributions with a time interval of 0.4 ns between figures for a spin polarized current of 100 µA being injected in a subset of an area of a nanomagnet of 80×20×2.5 nm size with a SHE wire (width=20 nm, offset=30 nm). That is spin polarized current is injected into an area on the right of the nanomagnet as illustrated in FIG. 1. Also a complete flip of magnetization first occurs on the right with a formation of a domain wall (FIG. 3F) separating the left pointing and right pointing magnetization. Then the domain wall propagates to the left resulting in complete magnetization direction switching. Note that significant changes of magnetization direction start right away after switching the current. This is the result of a higher current density and of a relative ease of deflecting magnetization in a small part of the nanomagnet rather than its whole area.

Figure 4:
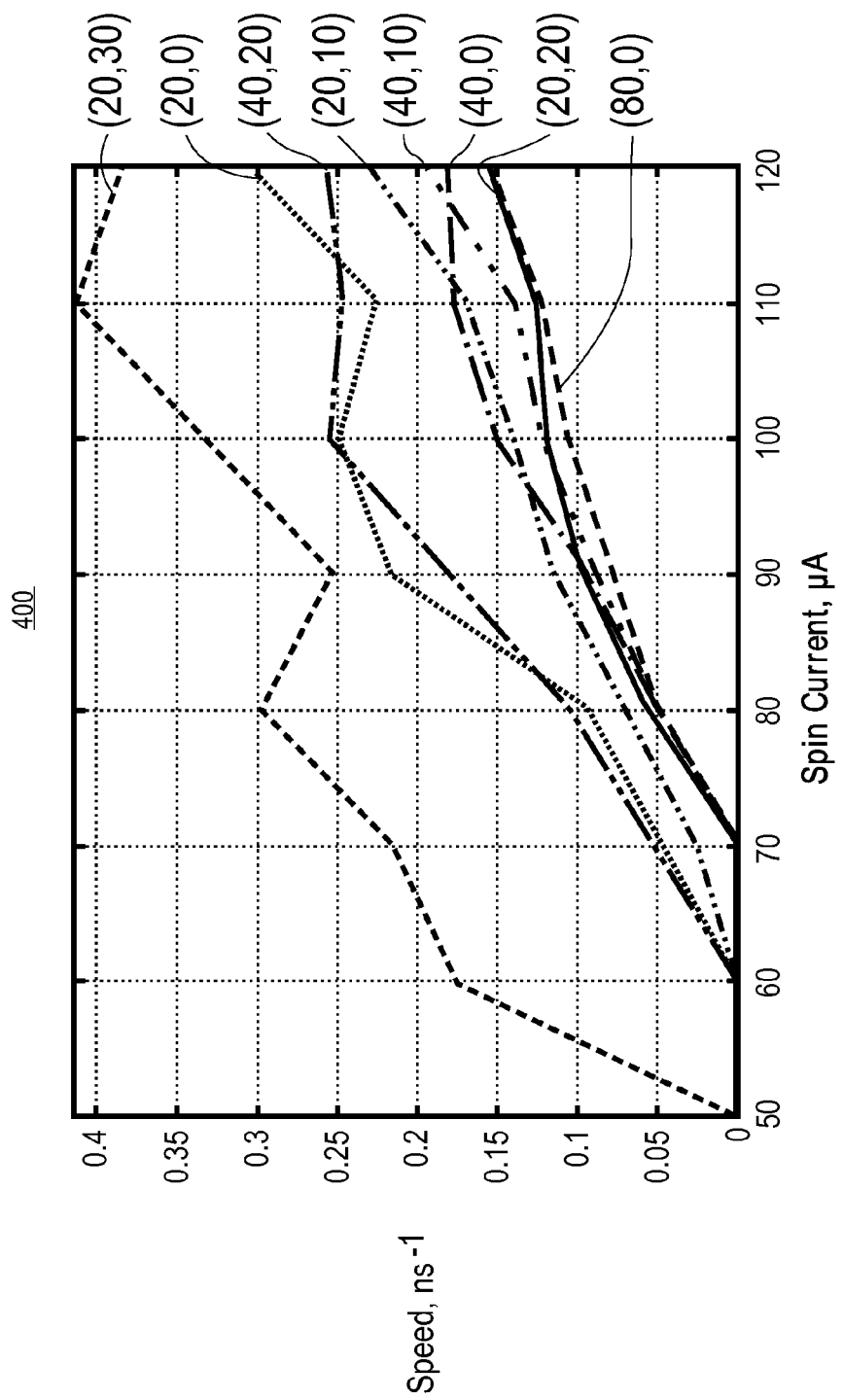
FIG. 4 illustrates a line graph showing results of simulations of switching speed versus applied spin polarized current in accordance with one embodiment.

FIG. 4 illustrates a line graph showing results of simulations of switching speed versus applied spin polarized current in accordance with one embodiment. Micromagnetic simulations for a 80×20 nm magnet and a range of layout parameters from 80 nm wide wires with 0 nm offset to 20 nm wires with 30 nm offset show the highest switching speed (~3 ns) which is significantly (e.g., 3 times) faster in the latter case than the former case. The lines in FIG. 4 represent different switching speeds for different wire geometries and offsets (e.g., (wire width=80, offset=0), (wire width=20, offset=20), (wire width=40, offset=0), (wire width=40, offset=10), (wire width=20, offset=10), (wire width=40, offset=20), (wire width=20, offset=0), (wire width=20, offset=30)) as labeled on the right edge of the graph 400. For spin current less than a critical current, no switching occurs. The critical current for each line occurs when the switching speed is zero. The straightforward geometry (wire width=80, offset=0) in which the torque is applied over the whole area of the nanomagnet (the conventional case of FIGS. 2A-2H) shows the slowest switching. The thinnest SHE wire and the most extreme shift (the case of FIGS. 3A-3H with wire width=20, offset=30) produces the fastest switching. Intermediate values of layout parameters do not show a monotonic trend. This is related to a complicated interplay of varying current density and different magnetization oscillation modes which are excited for different positions in applying the SHE torque. The graph 400 show that the threshold spin current decreases from 70 µA in non-optimized cases to 50 µA for the case of a 20 nm width and maximal shift of the wire (offset=30 nm). For intermediate values of current (around 80 uA) this corresponds to 2-3× higher switching speed.

The present disclosure discusses improvements of Spin Hall Effect switching by optimizing the geometry of the memory cell. A significant impact is realized by narrowing the SHE wire and shifting it to the edge of the nanomagnet in order to achieve a better leverage for the SHE torque.

Figure 5:
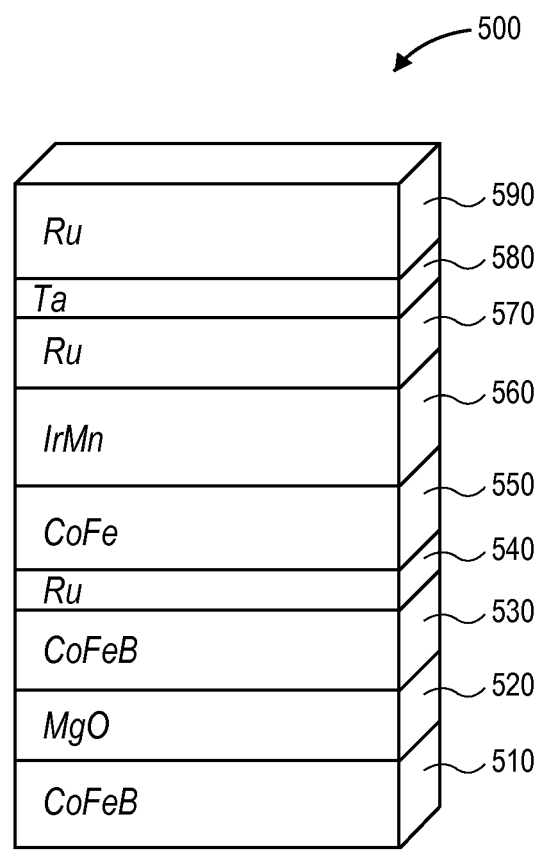
FIG. 5 illustrates a nanomagnet 500 in accordance with one embodiment.

FIG. 5 illustrates a nanomagnet 500 in accordance with one embodiment. A wide combination of materials can be used for material stacking of the nanomagnet. In this embodiment, the stack of materials include: a free magnetic layer 510 (e.g., $Co_xFe_yB_z$), tunneling layer 520 (e.g., MgO), a fixed magnetic layer 530 (e.g., $Co_xFe_yB_z$), an exchange coupling layer 540 (e.g., Ru), a fixed magnetic layer 550 (e.g., $Co_xFe_y$), an anti-ferromagnetic pinning layer 560 (e.g., IrMn), and cap layers such as layer 570 (e.g., Ru), layer 580 (e.g., Ta), and layer 590 (e.g., Ru), where 'x,' 'y,' and 'z' are integers. In other embodiments, other materials may be used to form the nanomagnet which may include a fixed magnetic layer and a free magnetic layer for a magnetic tunnel junction device. In alternative embodiments, the nanomagnet does not include a magnetic tunnel junction device.

In certain aspects and at least some embodiments of the present invention, certain terms hold certain definable meanings. For example, a "free" magnetic layer is a magnetic layer storing a computational variable. A "fixed" magnetic layer is a magnetic layer with fixed magnetization (magnetically harder than the free magnetic layer). A tunneling barrier, such as a tunneling dielectric layer (e.g., MgO) or tunneling oxide, is one located between free and fixed magnetic layers. A fixed magnetic layer may be patterned to create inputs and outputs to an associated circuit. Magnetization may be written by spin transfer torque effect while passing a current through the input electrodes. Magnetization may be read via the tunneling magneto-resistance effect while applying voltage to the output electrodes. In an embodiment, the role of the dielectric layer is to cause a large magneto-resistance ratio. The magneto-resistance is the ratio of the difference between resistances when the two ferromagnetic layers have anti-parallel magnetizations and the resistance of the state with the parallel magnetizations.

Referring to FIG. 5 the portion of the nanomagnet 500 including the free magnetic layers, the dielectric layer (tunneling barrier layer), and the fixed magnetic layer is known as a magnetic tunneling junction. The free magnetic layers and the fixed magnetic layer may be ferromagnetic layers. The dielectric layer (tunneling barrier layer), which separates a lower free magnetic layer and the fixed magnetic layer, may have a thickness, e.g., a distance between the free magnetic layer and the fixed magnetic layer of about 1 nanometer or less, such that electrons can tunnel there through, if a bias voltage is applied between the top and bottom electrodes.

In an embodiment, the MTJ functions essentially as a resistor, where the resistance of an electrical path through the MTJ may exist in two resistive states, either "high" or "low," depending on the direction or orientation of magnetization in the free magnetic layers and in the fixed magnetic layer. In the case that the directions of magnetization in the free magnetic layers and the fixed magnetic layer closest to it are substantially opposed or anti-parallel with one another, a high resistive state exists. In the case that the directions of magnetization in the coupled free magnetic layers and the fixed magnetic layer closest to it are substantially aligned or parallel with one another, a low resistive state exists. It is to be understood that the terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

In prior art, the direction of magnetization in free magnetic layers may be switched through a process called spin transfer torque ("STT") using a spin-polarized current. An electrical current in non-magnetic wires is generally non-polarized (e.g. consisting of about 50% spin-up and about 50% spin-down electrons). A spin polarized current is one with a greater number of electrons of either spin-up or spin-down, which may be generated by passing a current through a magnetic layer. The electrons of the spin polarized current from the fixed magnetic layer tunnel through the tunneling barrier or dielectric layer and transfer its spin angular momentum to the free magnetic layer, wherein the free magnetic layer will orient its magnetization direction from approximately anti-parallel to approximately parallel to that of the fixed magnetic layer. The free magnetic layer may be returned to its original orientation by reversing the direction of the current. In contrast, in one embodiment, the same functionality is achieved by the spin polarized current generated in the spin Hall wire.

Thus, the MTJ may store a single bit of information ("0" or "1") by its state of magnetization. The information stored in the MTJ is sensed by driving a current through the MTJ. The free magnetic layer(s) does not require power to retain its magnetic orientations. As such, the state of the MTJ is preserved when power to the device is removed. Therefore, a spin transfer torque memory bit cell is, in an embodiment, non-volatile.

Figure 6:
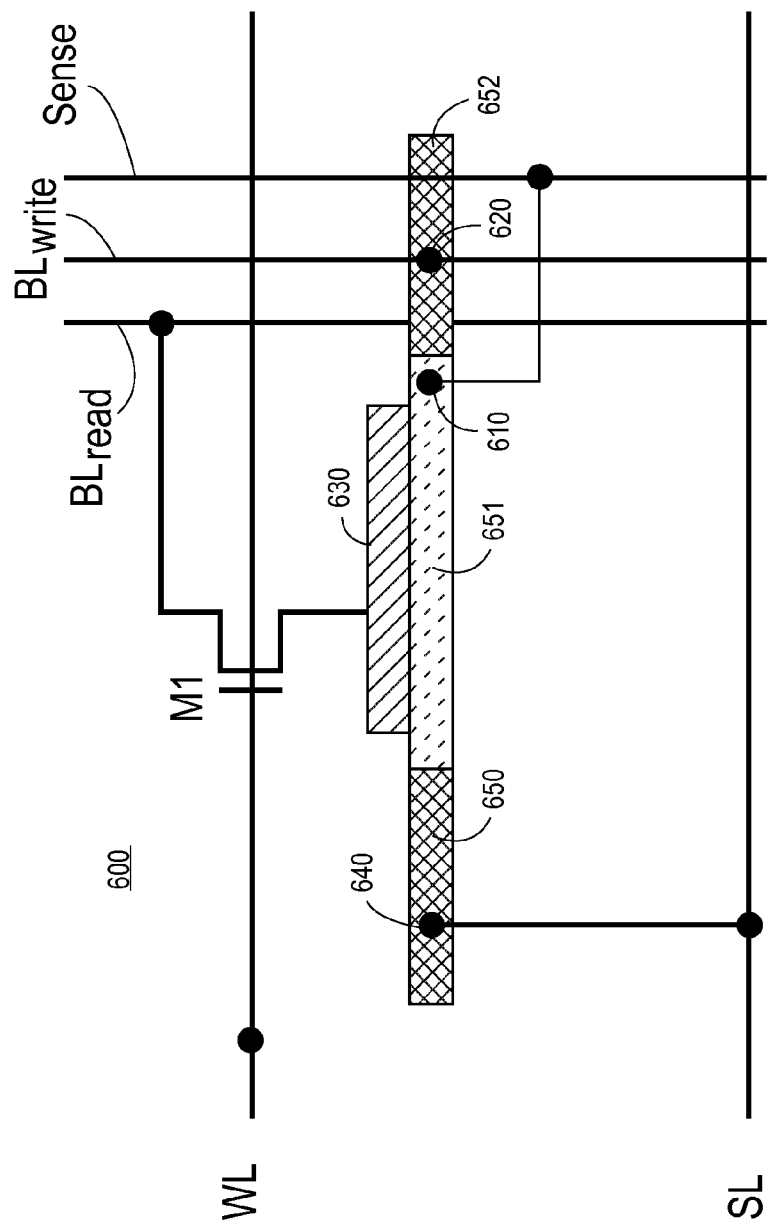
FIG. 6 illustrates a 1 transistor (1T) MTJ SHE RAM bit-cell 600, according to one embodiment of the disclosure.

FIG. 6 illustrates a 1 transistor (1T) SHE STT RAM bit-cell 600, according to one embodiment of the disclosure. In this embodiment, read and write bit line (BL) terminals are decoupled from one another forming two terminals, and the source line (SL), also referred to as the select line, forms a third terminal. The word line (WL) is a fourth terminal and the sense line is a fifth terminal. In one embodiment, bit-cell 600 includes a nanomagnet 630 with a free magnetic layer in direct contact with SHE metal 651, which is a metal that exhibits SHE properties. The metal 651 is in direct contact with a subset of a cross-sectional area of the nanomagnet 630. The write bit line is coupled to wire 652 at 620 while the optional sense line is coupled to the wire 652 at 610. The select line is coupled to wire 650 at 640. In one embodiment, bit-cell 600 includes transistor M1 with one of its drain/source terminals coupled to the nanomagnet 630, and the other of its source/drain terminals coupled to read bit line. In one embodiment, transistor M1 is an n-type transistor e.g., NMOS. In another embodiment, transistor M1 is a p-type transistor. A write operation occurs using the write bit line to establish a write path from 620 to 640 to the select line. A read operation occurs using the read bit line to establish read path from the transistor through the nanomagnet and metal 651 to 640 to the select line. Read and write bit lines provide different write and read paths in contrast to prior 1T SHE STT cells.

Figure 7:
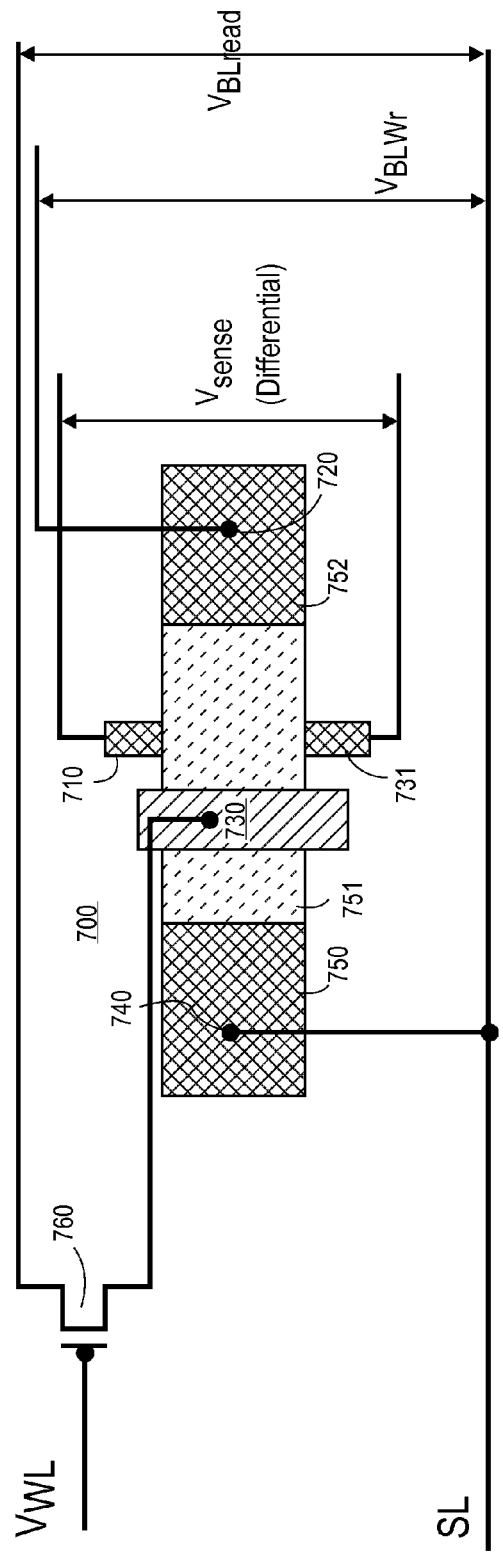
FIG. 7 illustrates a top view of 1 transistor (1T) MTJ SHE RAM bit-cell 700, according to one embodiment of the disclosure.

FIG. 7 illustrates a top view of 1 transistor (1T) SHE STT RAM bit-cell 700, according to one embodiment of the disclosure. In this embodiment, read and write bit line (BL) terminals are decoupled from one another forming two terminals, and the source line (SL), also referred to as the select line, forms a third line, forms a third terminal. The word line (WL) is a fourth terminal. In one embodiment, the sense line is a fifth terminal. In one embodiment, bit-cell 700 includes a nanomagnet 730 with a free magnetic layer in direct contact with SHE metal 751, which is a metal that exhibits SHE properties. The metal 751 is in direct contact with a subset of a cross-sectional area of the nanomagnet 730. The write bit line is coupled to wire 752 at 720 while the sense line is coupled to the SHE metal 751 at 710 and 731. The select line is coupled to wire 750 at 740. In one embodiment, bit-cell 700 includes transistor 760 with one of its drain/source terminals coupled to the nanomagnet 730, and the other of its source/drain terminals coupled to read bit line.

In one embodiment, to write data to bit-cell 600 or 700, spin current is injected in a subset of a cross-sectional area of the free magnetic layer of the MTJ device which is in direct contact with the interconnect formed from SHE material. In one embodiment, to read data from bit-cell 600 or 700, a sense amplifier senses read BL and SL. There are several advantages of the bit-cell 600 or 700 in comparison to a conventional bit cell. For example, the write and read operation of the bit-cell 600 or 700 are decoupled from one another allowing for highly optimized write operation, e.g., less than 10 ns with very low BER (bit error rate). Other advantages include, for example, the read path resistance can now be optimized for read sense amplifier requirements.

Figure 8:
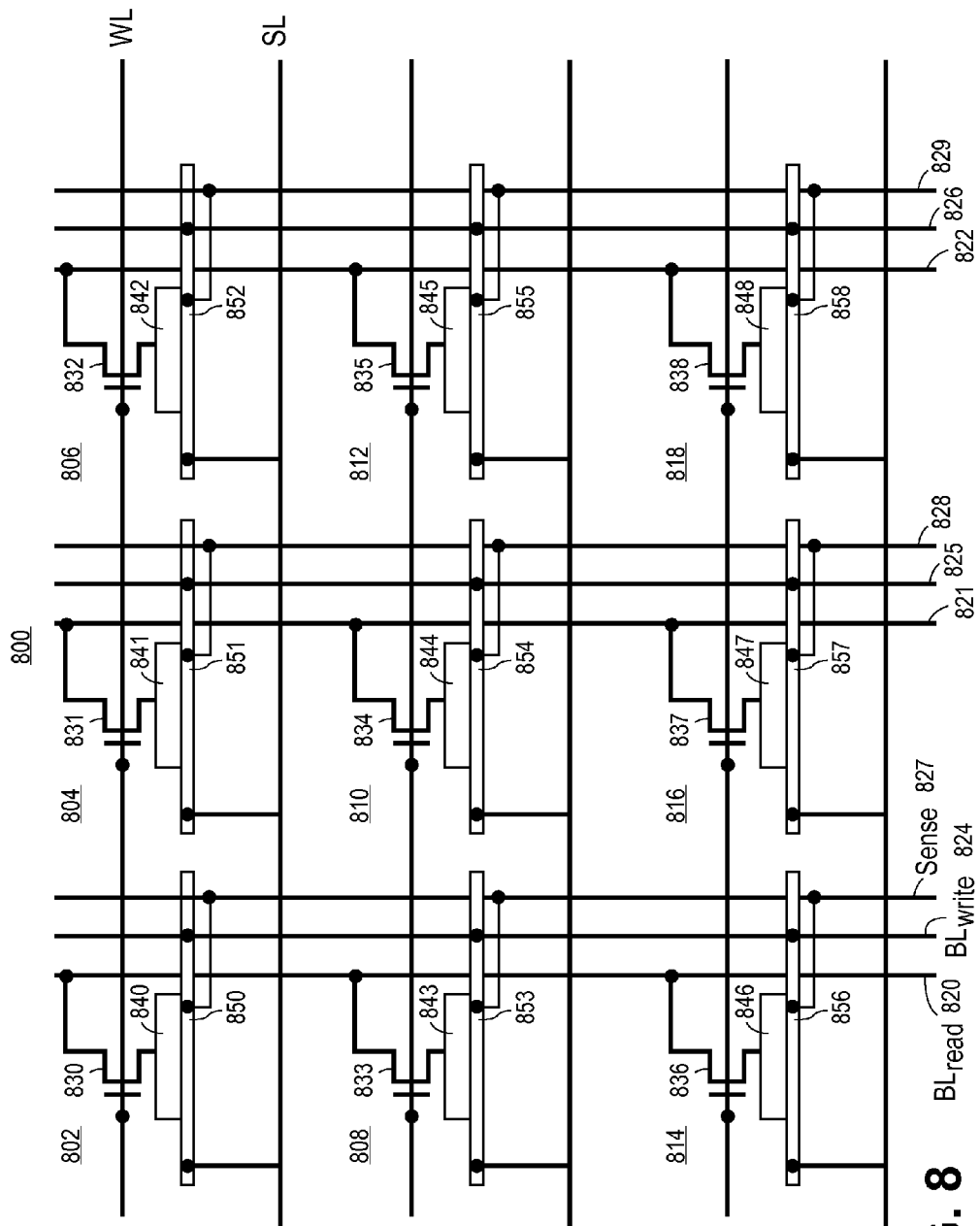
FIG. 8 illustrates an array of memory cells in accordance with one embodiment.

FIG. 8 illustrates an array of memory cells in accordance with one embodiment. The array of memory cells 800 includes memory cells 802, 804, 806, 808, 810, 812, 814, 816, and 818. The array includes read bit lines 820-822, and write bit lines 824-826. In an embodiment, an array includes sense lines 827-829. Each cell includes a transistor (e.g., 830-838), a nanomagnet (e.g., 840-848), and an interconnect (e.g., 850-858). Each transistor is coupled to a respective read bit line. Each nanomagnet is coupled to a respective interconnect, which includes SHE material. Each nanomagnet may include a free magnetic layer in which a subset of the cross-sectional area of the free magnetic layer is coupled to the SHE material.

In one embodiment, a longitudinal axis of each nanomagnet is approximately perpendicular with respect to a longitudinal axis of a respective SHE material. A center of mass of the SHE material is offset from a center of mass of the respective nanomagnet. The center of mass of the SHE material can be offset from the center of mass of the respective nanomagnet by ten to sixty nanometers.

In one embodiment, the center of mass of the SHE material is maximally displaced relative to the center of mass of the respective nanomagnet such that torque exerted by the SHE material causes switching of magnetization initially near an edge of the respective nanomagnet.

The SHE material of the interconnect may have a width of eighty nanometers or less.

The SHE material of the interconnect includes at least one of β-Tantalum (β-Ta), β-Tungsten (β-W) or Platinum.

Figure 9:
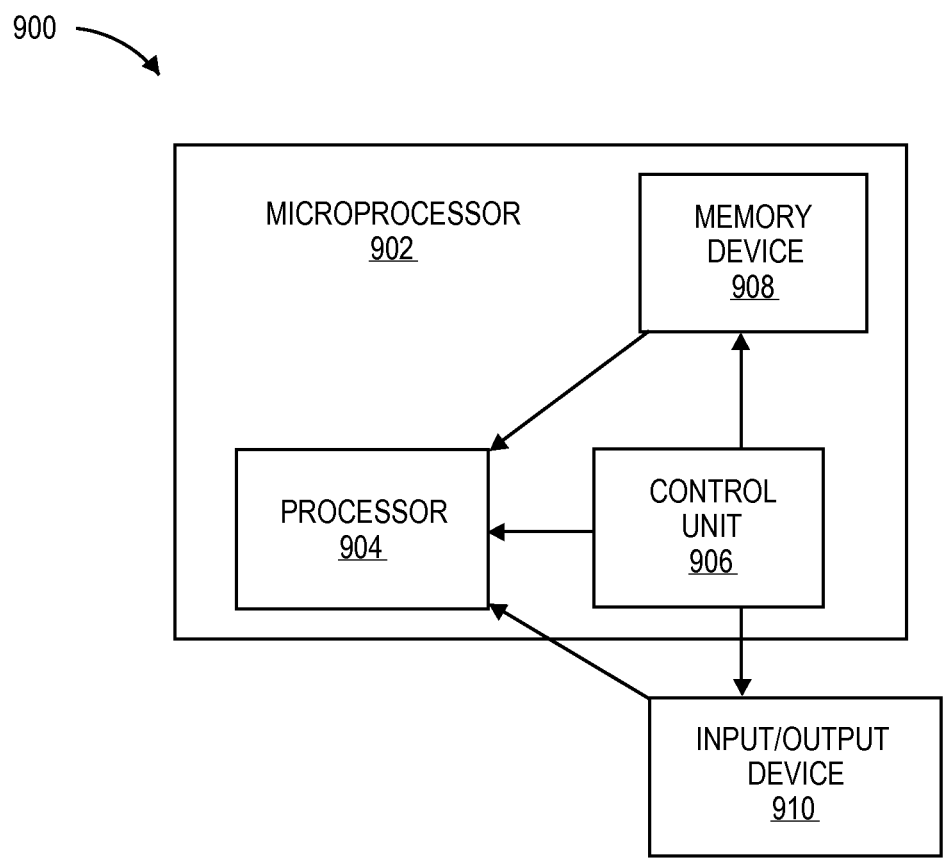
FIG. 9 illustrates a block diagram of an electronic system 900, in accordance with one embodiment.

FIG. 9 illustrates a block diagram of an electronic system 900, in accordance with one embodiment. The electronic system 900 can correspond to, for example, a portable system, a computer system, a process control system, or any other system that utilizes a processor and an associated memory. The electronic system 900 may include a microprocessor 902 (having a processor 904 and control unit 906), a memory device 908, and an input/output device 910 (it is to be understood that the electronic system 900 may have a plurality of processors, control units, memory device units and/or input/output devices in various embodiments). In one embodiment, the electronic system 900 has a set of instructions that define operations which are to be performed on data by the processor 904, as well as, other transactions between the processor 904, the memory device 908, and the input/output device 910. The control unit 906 coordinates the operations of the processor 904, the memory device 908 and the input/output device 910 by cycling through a set of operations that cause instructions to be retrieved from the memory device 908 and executed. The memory device 908 can include a SHE memory cell as described in the present description. In an embodiment, the memory device 908 is embedded in the microprocessor 902, as depicted in FIG. 9.

Figure 10:
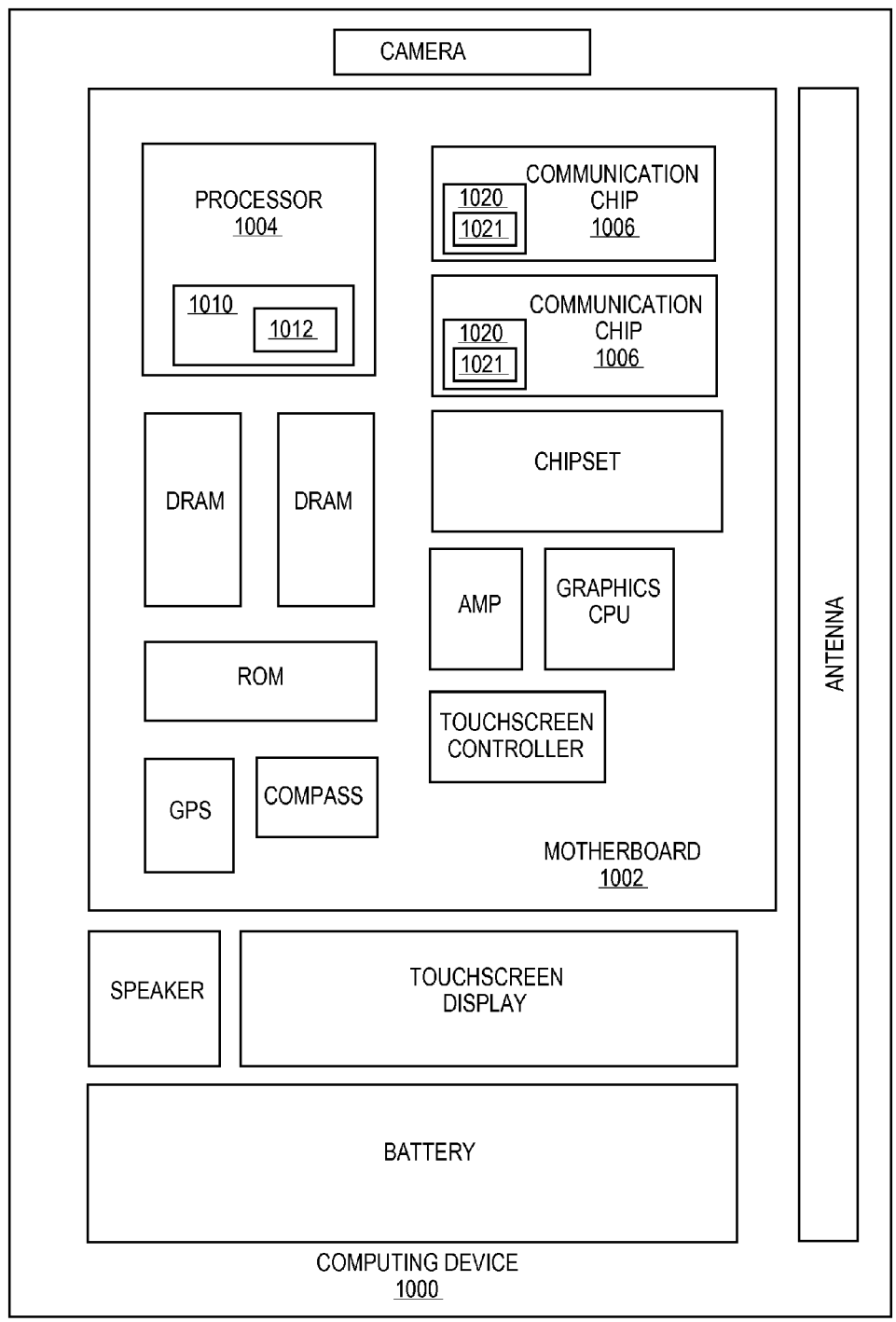
FIG. 10 illustrates a computing device 1000 in accordance with one embodiment.

FIG. 10 illustrates a computing device 1000 in accordance with one embodiment. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die 1010 packaged within the processor 1004. In some implementations of the invention, the integrated circuit die of the processor includes one or more devices 1012, such as SHE memory cell built in accordance with implementations of the invention. The term "processor" may refer to any device or portion of a device that processes electronic data from registers and/or memory to transform that electronic data into other electronic data that may be stored in registers and/or memory.

The communication chip 1006 also includes an integrated circuit die 1020 packaged within the communication chip 1006. In accordance with another implementation of the invention, the integrated circuit die of the communication chip includes one or more devices 1021, such as SHE memory cell built in accordance with implementations of the invention.

In further implementations, another component housed within the computing device 1000 may contain an integrated circuit die that includes one or more devices, such as SHE memory cell built in accordance with implementations of the invention.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Accordingly, one or more embodiments of the present invention relate generally to the fabrication of microelectronic memory. The microelectronic memory may be non-volatile, wherein the memory can retain stored information even when not powered. One or more, embodiments of the present invention relate to a SHE memory cell for non-volatile microelectronic memory devices. Such an element may be used in an embedded non-volatile memory, either for its non-volatility, or as a replacement for embedded dynamic random access memory (eDRAM). For example, such an element may be used for 1T-1X memory (X=capacitor or resistor) at competitive cell sizes within a given technology node.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus 120 includes a nanomagnet 100 having a cross-sectional area and a spin Hall effect (SHE) material that is coupled to a subset of the cross-sectional area of the nanomagnet. The SHE material generates spin current that is injected from the SHE material into a subset of the cross-sectional area of the nanomagnet.

In another example, the nanomagnet 100 includes longitudinal axis and a wire 110 having spin Hall effect (SHE) material having a longitudinal axis. The SHE material is coupled to the nanomagnet with the longitudinal axis of the nanomagnet being approximately perpendicular with respect to a longitudinal axis of the wire having SHE material. A center of mass of the SHE material is offset from a center of mass of the nanomagnet. Spin current is injected from the SHE material into a subset (e.g., less than 50%, less than 40%) of a cross-sectional area (length×width) of the nanomagnet.

The center of mass of the SHE material may be offset from the center of mass of the nanomagnet by ten to sixty nanometers. The center of mass of the SHE material may be maximally displaced relative to the center of mass of the nanomagnet such that torque exerted by the SHE material causes switching of magnetization initially near an edge of the nanomagnet.

The SHE material may have a width of eighty nanometers or less. The nanomagnet may include a free magnetic layer (e.g., CoFeB) that is coupled to the SHE material.

In one embodiment, in another example, a memory cell includes a select line, an interconnect with Spin Hall Effect (SHE) material. The interconnect is coupled to a write bit line and the select line. A transistor is coupled to a read bit line with the transistor being controlled by a word line. A nanomagnet having a free magnetic layer is coupled to the interconnect. The SHE material is coupled to a subset of the cross-sectional area of the nanomagnet.

The SHE material is coupled to the nanomagnet and a longitudinal axis of the nanomagnet may be approximately perpendicular with respect to a longitudinal axis of the SHE material. A center of mass of the SHE material is offset from a center of mass of the nanomagnet device.

In another example, the center of mass of the SHE material is offset from the center of mass of the nanomagnet by ten to sixty nanometers. In another example, the center of mass of the SHE material is maximally displaced relative to the center of mass of the nanomagnet such that torque exerted by the SHE material causes efficient switching of magnetization initially near a perimeter or edge of the nanomagnet.

In one embodiment, the SHE material has a width of eighty nanometers or less. The SHE material includes at least one of β-Tantalum (β-Ta), β-Tungsten (β-W) or Platinum. The memory cell further includes a sense line coupled to the interconnect.

In one embodiment, for another example, an array of memory cells 800 includes read bit lines, write bit lines. In one embodiment, it further includes sense lines. Each memory cell includes a transistor, a nanomagnet, and an interconnect. Each transistor is coupled to a respective read bit line. Each nanomagnet is coupled to a respective interconnect, which includes SHE material. Each nanomagnet may include a free magnetic layer that is coupled to the SHE material. SHE material generates spin current that is injected from the SHE material into a subset of a cross-sectional area of each respective nanomagnet.

In another example, a longitudinal axis of each nanomagnet is approximately perpendicular with respect to a longitudinal axis of a respective SHE material. A center of mass of the SHE material is offset from a center of mass of the respective nanomagnet. The center of mass of the SHE material can be offset from the center of mass of the respective nanomagnet by ten to sixty nanometers.

In one embodiment, the center of mass of the SHE material is maximally displaced relative to the center of mass of the respective nanomagnet such that torque exerted by the SHE material causes switching of magnetization initially near a perimeter or edge of the respective nanomagnet.

In another example, the SHE material of the interconnect may have a width of eighty nanometers or less. The SHE material of the interconnect includes at least one of β-Tantalum (β-Ta), β-Tungsten (β-W) or Platinum.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus, comprising:
   a nanomagnet having a cross-sectional area; and
   a spin Hall effect (SHE) material that is physically coupled to only a subset of the cross-sectional area of the nanomagnet, wherein the cross-sectional area of the nanomagnet is defined by a length and a width of the nanomagnet, wherein a center of mass of the SHE material is offset from a center of mass of the nanomagnet by ten to sixty nanometers to displace an area of application of spin torque to produce a non-uniform distribution of magnetization in a switching process of the nanomagnet for efficient switching of magnetization, wherein the SHE material includes at least one of β-Tantalum (β-Ta), β-Tungsten (β-W) or Platinum.

2. The apparatus of claim 1, wherein the center of mass of the SHE material is maximally displaced relative to the center of mass of the nanomagnet such that torque exerted by the SHE material causes switching of magnetization initially near an edge of the nanomagnet and then a switching direction propagates to other portions of the nanomagnet.

3. The apparatus of claim 1, wherein the SHE material has a width of eighty nanometers or less, wherein the SHE material generates spin current that is injected from the SHE material into a subset of the cross-sectional area of the nanomagnet.

4. The apparatus of claim 1, wherein the SHE material includes a longitudinal axis that is approximately perpendicular with respect to a longitudinal axis of the nanomagnet.

5. The apparatus of claim 1, wherein the SHE material is in the form of a wire that is approximately perpendicular with respect to the longitudinal axis of the nanomagnet.

6. The apparatus of claim 1, wherein the SHE material includes at least one of β-Tantalum (β-Ta) and β-Tungsten (β-W) or Platinum.

7. An memory cell comprising:
a select line;
an interconnect with Spin Hall Effect (SHE) material, the interconnect coupled to a write bit line and the select line;
a transistor coupled to a read bit line, the transistor controllable by a word line; and
a nanomagnet coupled to the interconnect, wherein the SHE material is physically coupled to only a subset of a cross-sectional area of the nanomagnet, wherein the cross-sectional area of the nanomagnet is defined by a length and a width of the nanomagnet, wherein a center of mass of the SHE material is offset from a center of mass of the nanomagnet by ten to sixty nanometers to displace an area of application of spin torque to produce a non-uniform distribution of magnetization in a switching process of the nanomagnet for efficient switching of magnetization, wherein the SHE material includes at least one of β-Tantalum (β-Ta), β-Tungsten (β-W) or Platinum.

8. The memory cell of claim 7, wherein the SHE material is coupled to the nanomagnet with a longitudinal axis of the nanomagnet being approximately perpendicular with respect to a longitudinal axis of the SHE material, wherein a center of mass of the SHE material is offset from a center of mass of the nanomagnet device.

9. The memory cell of claim 8, wherein the center of mass of the SHE material is maximally displaced relative to the center of mass of the nanomagnet such that torque exerted by the SHE material causes switching of magnetization initially near an edge of the nanomagnet.

10. The memory cell of claim 7, wherein the SHE material has a width of eighty nanometers or less.

11. The memory cell of claim 7, wherein the nanomagnet further comprises a free magnetic layer that is coupled to the SHE material.

12. The memory cell of claim 7, wherein the SHE material includes at least one of β-Tantalum (β-Ta) and β-Tungsten (β-W) or Platinum.

13. The memory cell of claim 7, further comprising:
a sense line coupled to the interconnect.

14. An array of memory cells comprising:
a plurality of read bit lines;
a plurality of write bit lines;
a plurality of interconnects with Spin Hall Effect (SHE) material;
a plurality of transistors with each transistor being coupled to a read bit line; and
a plurality of nanomagnets coupled to the plurality of interconnects, wherein the SHE material is physically coupled to only a subset of a cross-sectional area of each respective nanomagnet, wherein the cross-sectional area of the nanomagnet is defined by a length and a width of the nanomagnet, wherein a center of mass of the SHE material is offset from a center of mass of the nanomagnet by ten to sixty nanometers to displace an area of application of spin torque to produce a non-uniform distribution of magnetization in a switching process of the nanomagnet for efficient switching of magnetization, wherein the SHE material includes at least one of β-Tantalum (β-Ta), β-Tungsten (β-W) or Platinum.

15. The array of memory cells of claim 14, wherein the SHE material is coupled to the plurality of nanomagnets with a longitudinal axis of each nanomagnet being approximately perpendicular with respect to a longitudinal axis of a respective SHE material, wherein a center of mass of the SHE material is offset from a center of mass of the respective nanomagnet.

16. The array of memory cells of claim 15, wherein the center of mass of the SHE material is maximally displaced relative to the center of mass of the respective nanomagnet such that torque exerted by the SHE material causes switching of magnetization initially near an edge of the respective nanomagnet.

17. The array of memory cells of claim 14, wherein the SHE material has a width of eighty nanometers or less.

18. The array of memory cells of claim 14, wherein each nanomagnet further comprises a free magnetic layer that is coupled to the SHE material.

19. The array of memory cells of claim 14, wherein the SHE material includes at least one of β-Tantalum (β-Ta) and β-Tungsten (β-W).

* * * * *